(12) United States Patent
Kato et al.

(10) Patent No.: US 7,829,957 B2
(45) Date of Patent: Nov. 9, 2010

(54) SEMICONDUCTOR DEVICE AND MANUFACTURING METHOD THEREOF

(75) Inventors: Yoshiaki Kato, Toyama (JP); Yoshiharu Anda, Toyama (JP); Akihiko Nishio, Toyama (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 12/054,800

(22) Filed: Mar. 25, 2008

(65) Prior Publication Data

US 2008/0251837 A1 Oct. 16, 2008

(30) Foreign Application Priority Data

Apr. 13, 2007 (JP) ............................. 2007-106484

(51) Int. Cl.
*H01L 29/76* (2006.01)
(52) U.S. Cl. ............... 257/392; 257/205; 257/E21.631; 257/E21.061; 438/217; 438/276; 438/289; 438/291
(58) Field of Classification Search ............. 257/392, 257/205, E21.163, E27.061; 438/217, 276, 438/289, 291
See application file for complete search history.

(56) References Cited

U.S. PATENT DOCUMENTS

| | | | |
|---|---|---|---|
| 4,849,368 A * | 7/1989 | Yamashita et al. | 438/172 |
| 5,514,605 A | 5/1996 | Asai et al. | |
| 6,703,638 B2 * | 3/2004 | Danzilio | 257/12 |
| 7,183,592 B2 * | 2/2007 | Hwang | 257/194 |
| 2005/0263789 A1 * | 12/2005 | Hwang | 257/194 |
| 2006/0284212 A1 * | 12/2006 | Murayama et al. | 257/197 |
| 2007/0295991 A1 | 12/2007 | Kato et al. | |

FOREIGN PATENT DOCUMENTS

| | | |
|---|---|---|
| JP | 8-116034 | 5/1996 |
| JP | 3483716 | 10/2003 |

OTHER PUBLICATIONS

English language Abstract of JP 8-116034.
English language Abstract of JP 10-173137.

* cited by examiner

*Primary Examiner*—Andy Huynh
(74) *Attorney, Agent, or Firm*—Greenblum & Bernstein, P.L.C.

(57) ABSTRACT

A semiconductor device which includes both an E-FET and a D-FET and can facilitate control of the Vth in an E-FET and suppress a decrease in the Vf, and a manufacturing method of the same are provided. A semiconductor device which includes both an E-FET and a D-FET on the same semiconductor substrate includes: a first threshold adjustment layer for adjusting threshold of the E-FET; a first etching stopper layer formed on the first threshold adjustment layer; the second threshold adjustment layer formed on the first etching stopper layer for adjusting threshold of the D-FET; a second etching stopper layer formed on the second threshold adjustment layer; a first gate electrode penetrating through the first etching stopper layer, the second threshold adjustment layer, and the second etching stopper layer, which is in contact with the first threshold adjustment layer; and the second gate electrode penetrating through the second etching stopper layer, which is in contact with the second threshold adjustment layer.

9 Claims, 8 Drawing Sheets

SEMICONDUCTOR DEVICE AND MANUFACTURING METHOD THEREOF

BACKGROUND OF THE INVENTION (1) Field of the Invention

The present invention relates to semiconductor devices and manufacturing methods thereof. More particularly, the present invention relates to a semiconductor device which includes at least two kinds of field-effect transistors having different threshold voltages integrated on a compound semiconductor substrate, and to a manufacturing method thereof.

(2) Description of the Related Arts

Field effect transistors formed on semi-insulating substrates made of GaAs (hereinafter referred to as GaAsFET) have been used for power amplifiers or switches of communication devices, especially mobile telephone terminals, due to its high performance. Particularly, monolithic microwave integrated circuits (hereinafter referred to as MMIC) in which active elements such as the GaAsFET and passive elements such as a resistance element and a capacitance element are integrated thereon have been widely in practical use.

In recent years, higher performance in the above-described GaAsMMIC has been demanded. Thus, the GaAsMMIC which includes the aforementioned power amplifiers and switches structured by a depletion-mode field-effect transistor (hereinafter referred to as D-FET) and a logic circuit structured by an enhancement-mode field-effect transistor (hereinafter referred to as E-FET), in other words, an E/D-FET in which the E-FET and the D-FET are both mounted on the same substrate is in demand.

Examples of conventional E/D-FETs include the semiconductor device disclosed in Patent reference 1: Japanese Unexamined Patent Application Publication NO. 8-116034 and the semiconductor device disclosed in Patent reference 2: Japanese Patent NO. 3483716.

First, a conventional semiconductor device disclosed in Patent reference 1 will be described. FIG. 1 is a sectional view which illustrates a structure of the semiconductor device disclosed in Patent reference 1.

A semiconductor device 300 illustrated in FIG. 1 includes an E-FET region 31 in which an E-FET is formed and a D-FET region 32 in which a D-FET is formed. The semiconductor device 300 includes: a semiconductor substrate 301 made of semi-insulating GaAs, a buffer layer 302, a channel layer 303, a donor layer 304, a threshold adjustment layer 305, an etching stopper layer 306, a contact layer 307, an isolation region 308, an insulating film 309, a sidewall insulating films 312, gate electrodes 314 and 315, and ohmic electrodes 316.

The buffer layer 302 is made of undoped GaAs and formed on the semiconductor substrate 301. The channel layer 303 is made of undoped InGaAs and formed on the buffer layer 302. The donor layer 304 is made of n-type AlGaAs and formed on the channel layer 303. The threshold adjustment layer 305 is made of n-type GaAs and formed on the donor layer 304. The etching stopper layer 306 is made of n-type AlGaAs and formed on the threshold adjustment layer 305. The contact layer 307 is made of n-type GaAs and formed on the etching stopper layer 306. The isolation region 308 is formed through ion implantation and electrically isolates the E-FET region 31 from the D-FET region 32. The insulating film 309 is made using silicon dioxide film and formed on the contact layer 307. The gate electrode 314 forms a Schottky barrier junction with the donor layer 304. The gate electrode 315 forms a Schottky barrier junction with the etching stopper layer 306. The sidewall insulating films 312 are made using silicon dioxide film and isolate the contact layer 307 from the gate electrode 314 or from the gate electrode 315. The ohmic electrodes 316 are formed in openings defined in the insulating film 309, each of which is electrically connected to the contact layer 307.

A method of manufacturing the conventional semiconductor device 300 will be described next. FIGS. 2A to 2E illustrate sectional structures in a manufacturing process of the semiconductor device 300.

First, on the semiconductor substrate 301 made of semi-insulating GaAs, the GaAs buffer layer 302, the InGaAs channel layer 303, the AlGaAs donor layer 304, the GaAs threshold adjustment layer 305, the AlGaAs etching stopper layer 306 and the GaAs contact layer 307 are sequentially epitaxially grown through a metal organic chemical vapor deposition (hereinafter referred to as MOCVD) method, a molecular beam epitaxy (hereinafter referred to as MBE) method, and the like. The isolation region 308 is formed by implanting boron ions, so that the E-FET region 31 and the D-FET region 32 are separated. Through the steps described above, the structure illustrated in FIG. 2A is formed.

Next, the insulating film 309 is made using silicon dioxide film, and then a portion of the insulating film 309 for defining a gate opening is removed through selective dry-etching by using a photoresist mask (not illustrated), so that the contact layer 307 is exposed. Further, the exposed portion of the contact layer 307 is removed through selective dry-etching, so that the etching stopper layer 306 is exposed and gate openings 310 and 311 are defined. Through the steps described above, the structure illustrated in FIG. 2B is formed.

Next, the insulating film made using silicon dioxide film is formed on the gate openings 310 and 311, and then etched back through dry etching, so that the sidewall insulating films 312 are formed. Through the steps described above, the structure illustrated in FIG. 2C is formed.

Next, the gate opening 311 is covered with a photoresist mask (not illustrated), and the etching stopper layer 306 exposed in the gate opening 310 is removed through wet-etching using phosphate etchant, so that the threshold adjustment layer 305 is exposed. Further, the exposed threshold adjustment layer 305 is removed through selective dry-etching, so that the donor layer 304 is exposed and a gate opening 313 is formed. Through the steps described above, the structure illustrated in FIG. 2D is formed.

Next, a photoresist pattern is removed and WSi and W are laminated and then removed, leaving a portion to be a gate electrode, through dry-etching by using a photoresist mask (not illustrated), so that the E-FET gate electrode 314 and the D-FET gate electrode 315 are simultaneously formed. Through the steps described above, the structure illustrated in FIG. 2E is formed.

Next, an opening in which an ohmic electrode is to be formed is defined in the insulating film 309 by using a photoresist mask (not illustrated), and the ohmic electrode 316 made of AuGeNi is formed through the vacuum evaporation and lift-off method. Through the steps described above, the structure of the conventional semiconductor device 300 illustrated in FIG. 1 is formed.

Next, a conventional semiconductor device disclosed in Patent reference 2 will be described.

FIG. 3 is a sectional view which illustrates a structure of the semiconductor device disclosed in Patent reference 2.

A semiconductor device 400 illustrated in FIG. 3 includes an E-FET region 41 in which an E-FET is formed and a D-FET region 42 in which a D-FET is formed. The semiconductor device 400 includes: a semiconductor substrate 401 made of semi-insulating GaAs; a buffer layer 402; a channel layer 403; a donor layer 404; a threshold adjustment layer 405; a contact layer 406; an isolation region 407; an insulating film 409; gate electrodes 412 and 413; and ohmic electrodes 414.

The structure illustrated in FIG. 3 is different from the structure illustrated in FIG. 1, mainly in that the threshold adjustment layer 405 is included in place of the threshold adjustment layer 305 and the etching stopper layer 306. The single threshold adjustment layer 405 made of InGaP serves as the threshold adjustment layer 305 adjusting the threshold voltage and the etching stopper layer 306 to function as a stopper during the etching. Further difference is that the sidewall insulating films 312 are eliminated. A recess opening 408 and the insulating film 409 are provided for avoiding contact between the gate electrodes 412 and 413 and the contact layer 406 in FIG. 3, whereas the sidewall insulating films 312 are provided for avoiding contact between the gate electrodes 314 and 315 and the contact layer 307 in FIG. 1.

The semiconductor substrate 301, the buffer layer 302, the channel layer 303, the donor layer 304, the contact layer 307, the isolation region 308, the insulating film 309, the gate electrode 314, the gate electrode 315, and the ohmic electrode 316 correspond to the semiconductor substrate 401, the buffer layer 402, the channel layer 403, the donor layer 404, the contact layer 406, the isolation region 407, the insulating film 409, the gate electrode 412, the gate electrode 413, and the ohmic electrode 414, respectively.

Hereinafter, descriptions focus on the differences, omitting the same points. The threshold adjustment layer 405 is made of n-type InGaP and formed on the donor layer 404. The gate electrode 413 forms a Schottky barrier junction with the threshold adjustment layer 405.

A method of manufacturing the conventional semiconductor device 400 will be described next. FIGS. 4A to 4E illustrate sectional structures in a manufacturing process of the semiconductor device 400.

First, on the semiconductor substrate 401 made of semi-insulating GaAs, the GaAs buffer layer 402, the InGaAs channel layer 403, the AlGaAs donor layer 404, the InGaP threshold adjustment layer 405, the GaAs contact layer 406 are sequentially epitaxially grown through a MOCVD method, a MBE method, and the like. The isolation region 407 is formed by implanting hydrogen ions using a photoresist mask (not illustrated), so that the E-FET region 41 and the D-FET region 42 are separated. Through the steps described above, the structure illustrated in FIG. 4A is formed.

Next, predetermined portions in the contact layer 406 are removed through selective wet-etching using tartaric acid series etchant by using a photoresist mask (not illustrated), so that the threshold adjustment layer 405 is exposed and recess openings 408 are defined. Through the steps described above, the structure illustrated in FIG. 4B is formed.

Next, the insulating film 409 made using silicon dioxide film is formed, and then portions for forming gate electrodes in the insulating film 409 are removed through selective dry-etching by using a photoresist mask (not illustrated), so that the threshold adjustment layer 405 is exposed and gate openings 410 are defined. Through the steps described above, the structure illustrated in FIG. 4C is formed.

Next, the D-FET gate opening 410 is covered using a photoresist mask (not illustrated), and then the exposed threshold adjustment layer 405 in the E-FET gate opening is removed through selective wet-etching using hydrochloric acid etchant by using the insulating film 409 as a mask, so that the donor layer 404 is exposed and a gate opening 411 is defined. Through the steps described above, the structure illustrated in FIG. 4D is formed.

Next, gate metal made of WSi is deposited over the entire surface through a spattering method, and then removed, leaving portions to be gate electrodes, through dry-etching using a photoresist mask (not illustrated), so that the E-FET gate electrode 412 and the D-FET gate electrode 413 are formed. Through the steps described above, the structure illustrated in FIG. 4E is formed.

Next, openings in which ohmic electrodes are to be formed are defined in the insulating film 409 by using a photoresist mask (not illustrated), and the ohmic electrodes 414 made of AuGeNi are formed through a vacuum evaporation and lift-off method.

Through the steps described above, the structure of the conventional semiconductor device 400 illustrated in FIG. 3 is formed.

With the above-described conventional techniques, however, it is difficult to control the threshold voltage (hereinafter referred to as Vth) in the E-FET, and there is a further problem that forward voltage (hereinafter referred to as Vf) of the gate decreases.

With the semiconductor device 300 disclosed in Patent reference 1, for example, an etching with nm-level accuracy needs to be performed by sequence control when removing the etching stopper layer 306. Thus, there is a concern that etching might extend even to the donor layer 304 with which the gate electrode forms a Schottky barrier junction depending on conditions such as material or film thickness of the etching stopper layer 306 and the threshold adjustment layer 305. As a result, the Vth varies for each product. In other words, the controllability for the Vth, which aims to obtain a constant Vth, has a problem.

Further, in the semiconductor device 300 disclosed in Patent reference 1 and the semiconductor device 400 disclosed in Patent reference 2, the layer which forms a Schottky barrier junction with the E-FET gate electrodes 314 or 412 is the n-type GaAs donor layer 304 or 404. Thus, in the case where the gate electrode is formed on a semiconductor layer doped as n-type, the Vf decreases.

In other words, the conventional semiconductor devices which include both the E-FET and the D-FET have failed to achieve the feature and the accuracy required especially for the E-FET.

SUMMARY OF THE INVENTION

The present invention has been conceived in view of the above-described problems and aims to provide a semiconductor device which includes both the E-FET and the D-FET and can facilitate control of the Vth in the E-FET and suppress a decrease in the Vf, and a manufacturing method of the same.

In order to achieve the object described above, the semiconductor device according to the present invention, which includes an enhancement-mode field-effect transistor and a depletion-mode field-effect transistor on the same semiconductor substrate, comprises: a first threshold adjustment layer adjusting a threshold voltage of a gate of the enhancement-mode field-effect transistor; a first etching stopper layer formed on the first threshold adjustment layer; a second threshold adjustment layer formed on the first etching stopper layer, the second threshold adjustment layer adjusting the threshold voltage of a gate of the depletion-mode field-effect transistor; a second etching stopper layer formed on the second threshold adjustment layer; a first gate electrode of the enhancement-mode field-effect transistor, which is in contact with the first threshold adjustment layer, the first gate electrode penetrating through the first etching stopper layer, the second threshold adjustment layer, and the second etching stopper layer; and a second gate electrode of the depletion-mode field-effect transistor, which is in contact with the second threshold adjustment layer, the second gate electrode penetrating through the second etching stopper layer.

According to this structure, it is possible to facilitate etching to form openings for the first gate electrode and the second gate electrode, by including the first etching stopper layer and the second etching stopper layer, thereby preventing the controllability for the Vth from being impaired. Further, it is possible to suppress a decrease in the Vf by including the first threshold adjustment layer and the second threshold adjustment layer and by having the first gate electrode and the second gate electrode come in contact with the first threshold adjustment layer and the second threshold adjustment layer, respectively. As described above, it is possible to facilitate control of the Vth in the E-FET and to suppress a decrease in the Vf.

Further, the first etching stopper layer may include InGaP. According to this structure, it is possible, by using InGaP for the first etching stopper layer, to perform selective etching which removes the second threshold adjustment layer located on the first etching stopper layer, so as to expose the surface of the first etching stopper layer. Further, it is possible to perform selective etching which removes the first etching stopper layer so as to expose the surface of the first threshold adjustment layer. Accordingly, it is possible to form the semiconductor device which includes both the E-FET and the D-FET and has achieved the feature and the accuracy required for the E-FET, since the semiconductor device can be formed without impairing the controllability and the stability for the Vth.

Further, the second etching stopper layer may include disordered InGaP.

According to this structure, the InGaP of the second etching stopper layer is in a state of disorder. The disorder refers to the state that the atomic arrangement is in disorder, not orderly arranged. With this, it is possible to suppress on-resistance Ron (hereinafter referred to as Ron) which is a characteristic of the D-FET. Accordingly, it is possible to improve the characteristic of the D-FET.

Further, the first etching stopper layer may have a film thickness equal to or greater than a film thickness of the second etching stopper layer.

According to this structure, the InGaP layer which is the semiconductor layer adjacent to the first gate electrode that is the gate electrode of the E-FET has a thick film. Compared with the D-FET, the distance between the surface adjacent to the first gate electrode and the channel layer is shorter in the E-FET. In the case where the distance becomes shorter, the influence caused by the surface appears, and therefore there is a concern that the characteristic of FET might be impaired. The surface adjacent to the first gate electrode can be distanced from the channel layer by making the InGaP layer thicker, thereby suppressing the adverse effect caused by the surface. Accordingly, it is possible to improve the characteristic of the E-FET.

Further, the second threshold adjustment layer may include at least one layer with a top layer containing AlGaAs.

According to this structure, it is possible to form the D-FET having high breakdown voltage characteristics, by employing AlGaAs having a wide band gap for the second threshold adjustment layer which the second gate electrode that is the gate electrode of the D-FET is in contact with. Accordingly, it is possible to improve the characteristic of the D-FET.

Further, the second threshold adjustment layer may include a bottom layer containing GaAs.

According to this structure, it is possible to reduce the Ron of the D-FET, by inserting a low resistance GaAs layer under an AlGaAs layer. Accordingly, it is possible to improve the characteristic of the D-FET.

Further, the first threshold adjustment layer may include AlGaAs.

According to this structure, it is possible to form the E-FET having high breakdown voltage characteristics, by employing AlGaAs having a wide band gap for the first threshold adjustment layer which the first gate electrode that is the gate electrode of the D-FET is in contact with. Accordingly, it is possible to improve the characteristic of the E-FET.

Further, the semiconductor substrate may include one of GaAs and InP. According to this structure, it is possible to virtually match a lattice constant of the substrate and a lattice constant of the layer which is epitaxially grown on the substrate, thereby enabling growing a high quality crystal. Accordingly, it is possible to improve the characteristic of the E/D-FET.

Further, the semiconductor device may include: a contact layer formed on the second etching stopper layer; a first source electrode and a first drain electrode which are a source electrode and a drain electrode, respectively, in the enhancement-mode field-effect transistor, the first source electrode and said first drain electrode forming ohmic contact with the contact layer; and a second source electrode and a second drain electrode which are a source electrode and a drain electrode, respectively, in the depletion-mode field-effect transistor, the second source electrode and the second drain electrode forming ohmic contact with the contact layer, and in the semiconductor device, the first gate electrode, the second gate electrode, the first source electrode, the second source electrode, the first drain electrode, and the second drain electrode may be made of a same material.

According to this structure, electrodes of the E-FET and the D-FET are all formed with the same materials at the same time. This can reduce the number of processes for forming the electrodes. Accordingly, it is possible to lower the processing costs.

Further, the method for manufacturing the semiconductor device which includes an enhancement-mode field-effect transistor and a depletion-mode field-effect transistor according to the present invention comprises: forming a first threshold adjustment layer on a semiconductor substrate; forming a first etching stopper layer on the first threshold adjustment layer; forming a second threshold adjustment layer on the first etching stopper layer; forming a second etching stopper layer on the second threshold adjustment layer; forming a first gate electrode of the enhancement-mode field-effect transistor, which is in contact with the first threshold adjustment layer, the first gate electrode penetrating through the first etching stopper layer, the second threshold adjustment layer, and the second etching stopper layer; and forming a second gate electrode of the depletion-mode field-effect transistor, which is in contact with the second threshold adjustment layer, the second gate electrode penetrating through the second etching stopper layer.

According to this method, it is possible to facilitate etching for forming openings to be used for the first gate electrode and the second gate electrode, by forming the first etching stopper layer with high selectivity on the first threshold adjustment layer and forming the second etching stopper layer on the second threshold adjustment layer. Accordingly, it is possible to form a semiconductor device which includes both the E-FET and the D-FET and has achieved features required for the E-FET. Further, the first threshold adjustment layer forms a Schottky barrier junction with the first gate electrode, thereby suppressing decrease in the Vf. Accordingly, it is possible to form a semiconductor device which includes both the E-FET and the D-FET and has achieved features required for the E-FET.

Further, the method for manufacturing the semiconductor device may include forming a contact layer on the second etching stopper layer, and in this method, the forming of the first gate electrode may include: forming a first recess opening in a first portion of the contact layer so as to expose the first etching stopper layer; forming a first gate opening so as to expose the first threshold adjustment layer to the first recess opening; and forming the first gate electrode in the first gate opening, and the forming of the second gate electrode may include: forming a second recess opening in a second portion of the contact layer so as to expose the second etching stopper layer; forming a second gate opening so as to expose the second threshold adjustment layer to the second recess opening; and forming the second gate electrode in the second gate opening.

According to this method, the recess opening of the E-FET and the recess opening of the D-FET can be formed by a single photoresist mask for each of the recess openings. This can reduce the number of processes for forming the recess openings. Accordingly, it is possible to lower the processing costs.

Further, the forming of the first recess opening may include: forming an opening for exposing the second etching stopper layer simultaneously with the forming of the second recess opening; and forming the first recess opening by exposing the first etching stopper layer to the opening.

According to this method, the contact layer of the E-FET region and the contact layer of the D-FET region can be etched at the same time. Accordingly, it is possible to reduce the number of processes for forming the gate electrodes of the E-FET region and the D-FET region. Accordingly, it is possible to lower the processing costs.

Further, the forming of the first gate electrode and the forming of the second gate electrode may be performed simultaneously.

According to this structure, the first gate opening which is the gate opening of the E-FET and the second gate opening which is the gate opening of the D-FET can be formed at the same time. This can reduce the number of processes. Accordingly, it is possible to lower the processing costs for forming the gate openings.

Further, in the forming of the first gate electrode and the forming of the second gate electrode, the first gate electrode and the second gate electrode may be formed simultaneously with the same material.

According to this structure, the first gate electrode which is the gate electrode of the E-FET and the second gate electrode which is the gate electrode of the D-FET can be formed at the same time with the same material. This can reduce the number of processes for forming the electrodes. Accordingly, it is possible to lower the processing costs.

The present invention can provide a semiconductor device which includes both the E-FET and the D-FET and can facilitate control of the Vth in the E-FET and suppress reduction in the Vf, and a manufacturing method of the same.

FURTHER INFORMATION ABOUT TECHNICAL BACKGROUND TO THIS APPLICATION

The disclosure of Japanese Patent Application No. 2007-106484 filed on Apr. 13, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENTS

First Embodiment

A structure of a semiconductor device and a manufacturing method of the same according to the first embodiment of the present invention will be described below.

The semiconductor device of the present embodiment includes a first etching stopper layer and a second etching stopper layer, thereby improving controllability for the Vth. The semiconductor device of the present embodiment further includes a first threshold adjustment layer and a second threshold adjustment layer. A first gate electrode and a second gate electrode are in contact with the first threshold adjustment layer and the second threshold adjustment layer, respectively, thereby suppressing a decrease in the Vf.

Figure 1:
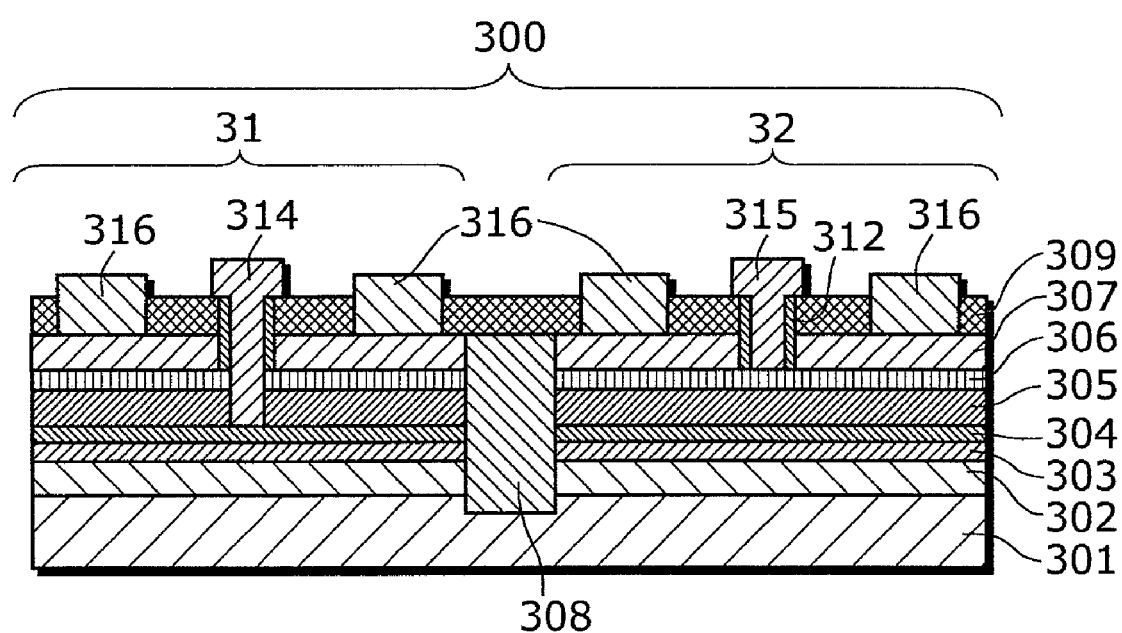
FIG. 1 is a sectional view illustrating a structure of a conventional semiconductor device.
Figure 2A:
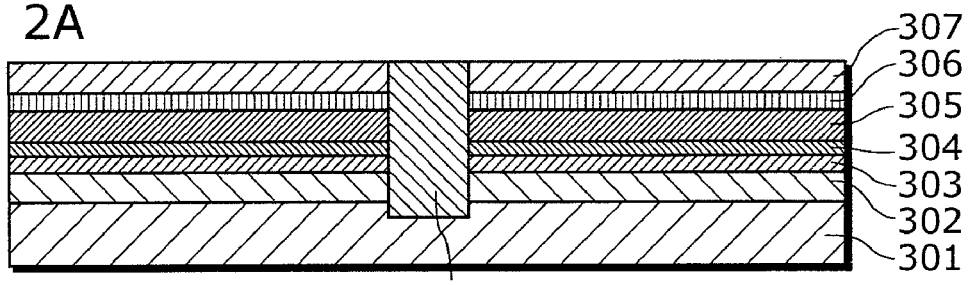
FIG. 2A illustrates a sectional structure in a manufacturing process of the conventional semiconductor device.
Figure 2B:
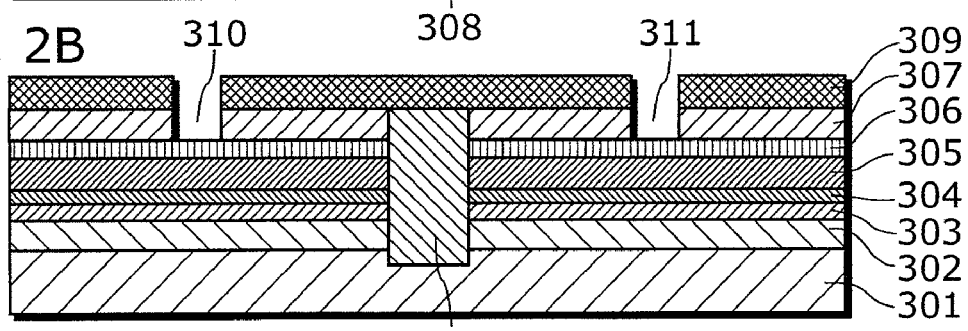
FIG. 2B illustrates a sectional structure in the manufacturing process of the conventional semiconductor device.
Figure 2C:
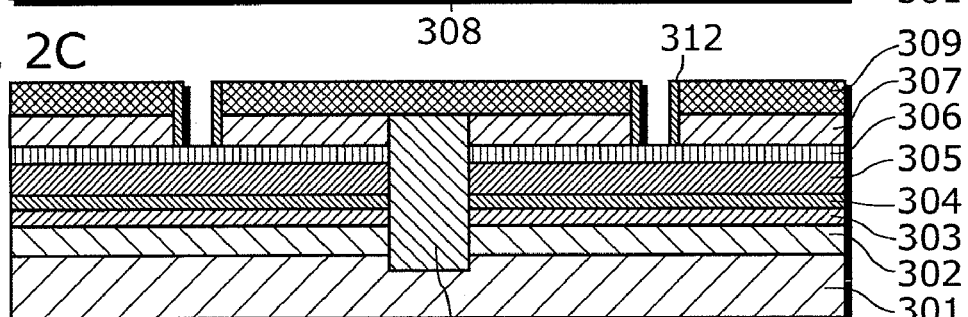
FIG. 2C illustrates a sectional structure in the manufacturing process of the conventional semiconductor device.
Figure 2D:
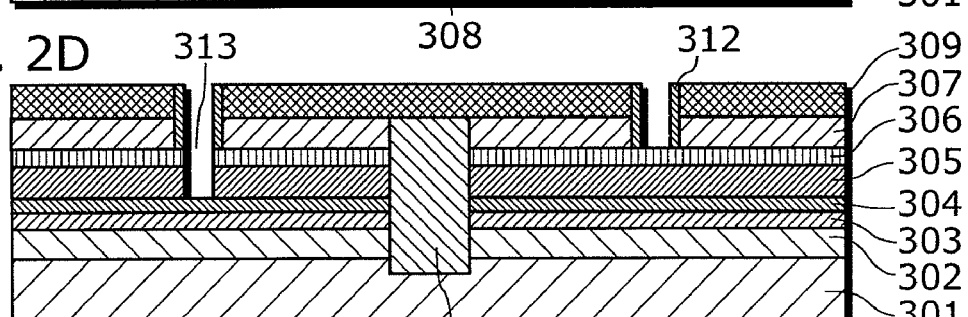
FIG. 2D illustrates a sectional structure in the manufacturing process of the conventional semiconductor device.
Figure 2E:
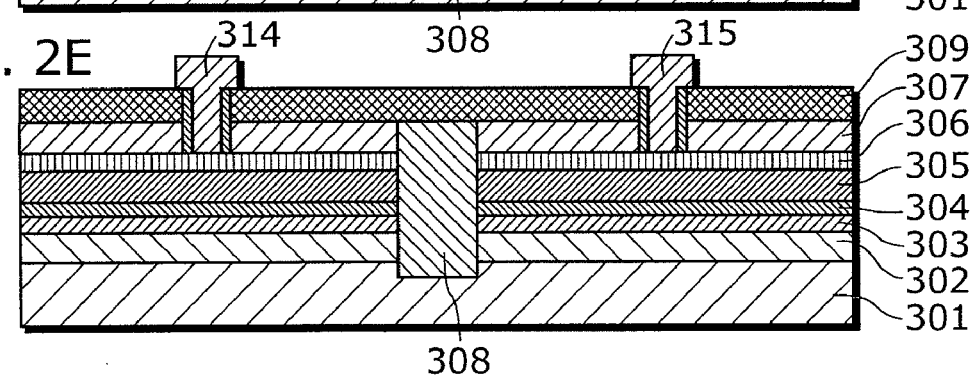
FIG. 2E illustrates a sectional structure in the manufacturing process of the conventional semiconductor device.
Figure 3:
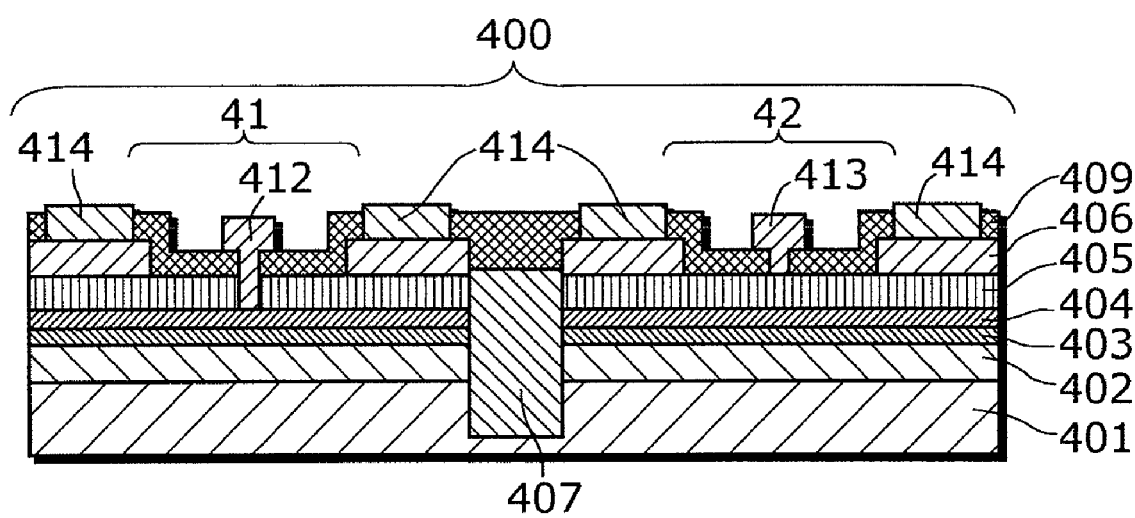
FIG. 3 is a sectional view illustrating a structure of a conventional semiconductor device.
Figure 4A:
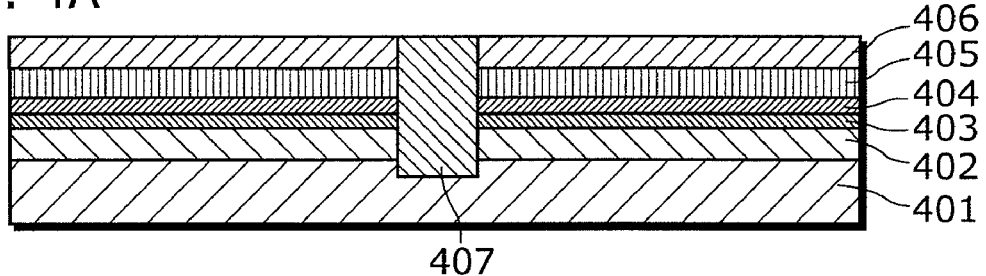
FIG. 4A illustrates a sectional structure in a manufacturing process of the conventional semiconductor device.
Figure 4B:
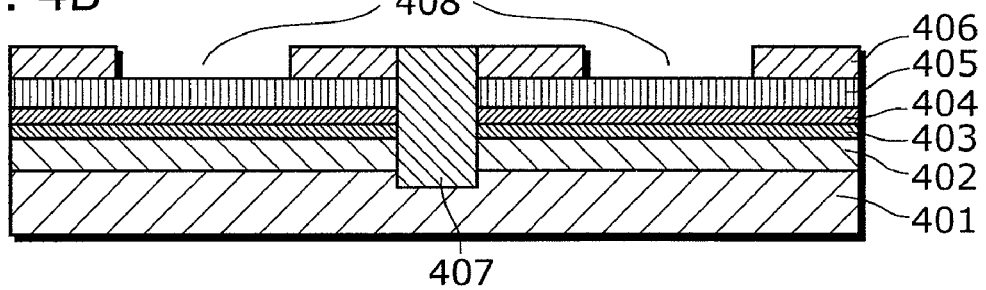
FIG. 4B illustrates a sectional structure in the manufacturing process of the conventional semiconductor device.
Figure 4C:
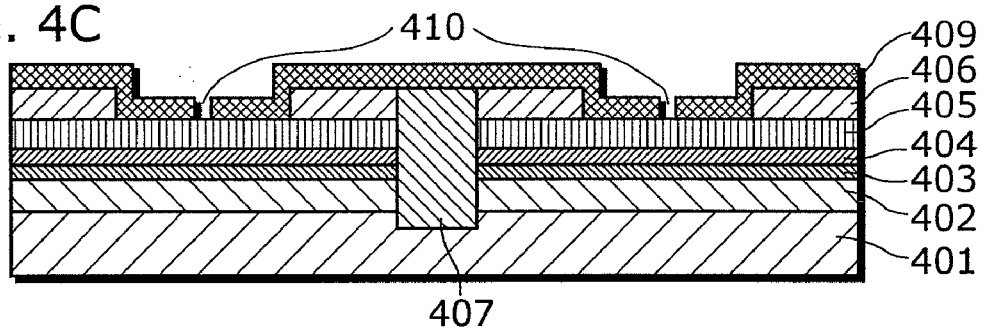
FIG. 4C illustrates a sectional structure in the manufacturing process of the conventional semiconductor device.
Figure 4D:
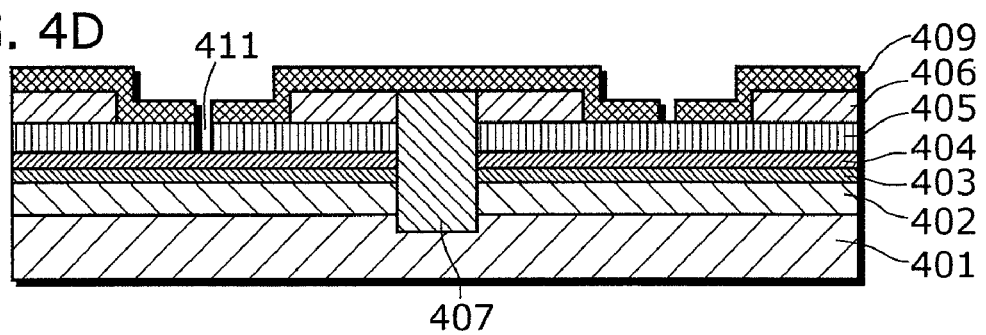
FIG. 4D illustrates a sectional structure in the manufacturing process of the conventional semiconductor device.
Figure 4E:
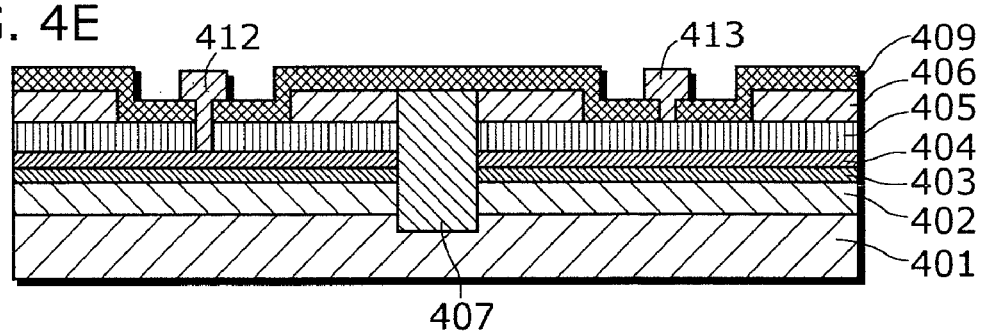
FIG. 4E illustrates a sectional structure in the manufacturing process of the conventional semiconductor device.
Figure 5:
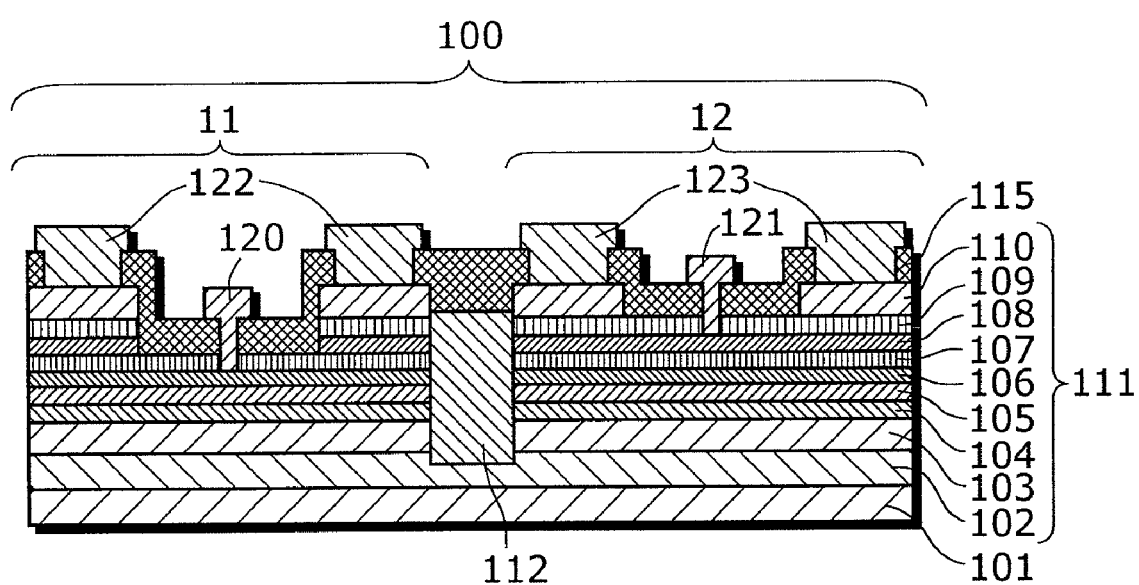
FIG. 5 is a sectional view illustrating a structure of a semiconductor device according to the first embodiment of the present invention.

FIG. 5 is a sectional view illustrating a structure of the semiconductor device according to an embodiment of the present invention.

A semiconductor device 100 illustrated in FIG. 5 includes an E-FET region 11 in which an E-FET is formed and a D-FET region 12 in which a D-FET is formed. The semiconductor device 100 includes: a semiconductor substrate 101 made of semi-insulating GaAs; an epitaxial layer 111; an isolation region 112; an insulating film 115; gate electrodes 120 and 121; and ohmic electrodes 122 and 123.

The epitaxial layer ill is formed through crystal growth of a semiconductor layer on the semiconductor substrate 101. The epitaxial layer 111 includes: buffer layers 102 and 103; a channel layer 104; a donor layer 105; a first threshold adjustment layer 106; a first etching stopper layer 107; a second threshold adjustment layer 108; a second etching stopper layer 109; and a contact layer 110.

The buffer layer 102 is formed on the semiconductor substrate 101. The buffer layer 102 is made of undoped GaAs and has a thickness of, for example, 1 μm. The buffer layer 103 is formed on the buffer layer 102 and made of undoped AlGaAs. The buffer layers 102 and 103 reduce the lattice mismatch between the epitaxial layer 111 and the substrate 101.

The channel layer 104 is formed on the buffer layer 103 and made of undoped $In_{0.2}Ga_{0.8}As$. with a thickness of 10 nm. The channel layer 104 is a layer on which carriers flow.

The donor layer 105 is formed on the channel layer 104 and made of AlGaAs with a thickness of 10 nm in which Si that is an n-type impurity ion is doped.

The first threshold adjustment layer 106 is formed on the donor layer 105 and made of undoped AlGaAs with a thickness of 5 nm.

Figure 6A:
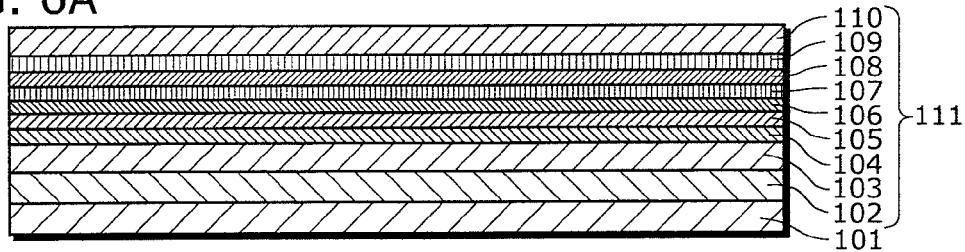
FIG. 6A illustrates a sectional structure in a manufacturing process of a semiconductor device.
Figure 6B:
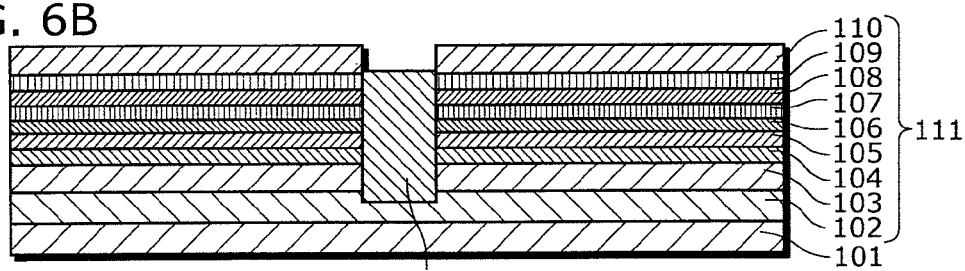
FIG. 6B illustrates a sectional structure in the manufacturing process of the semiconductor device.
Figure 6C:
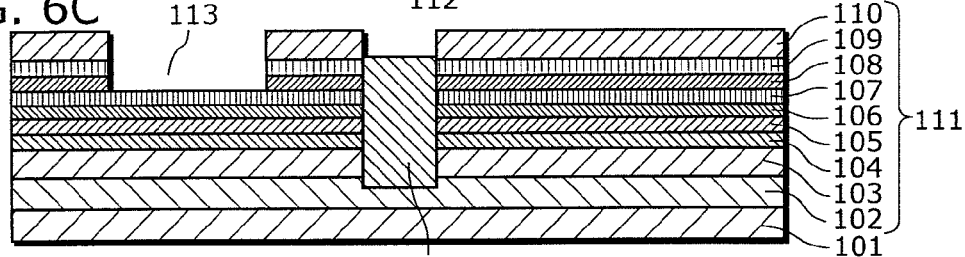
FIG. 6C illustrates a sectional structure in the manufacturing process of the semiconductor device.
Figure 6D:
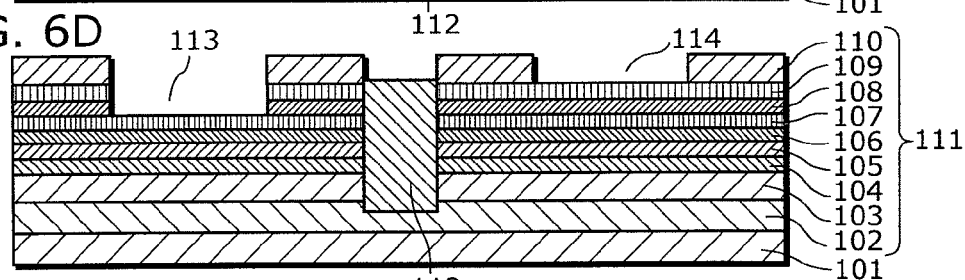
FIG. 6D illustrates a sectional structure in the manufacturing process of the semiconductor device.
Figure 6E:
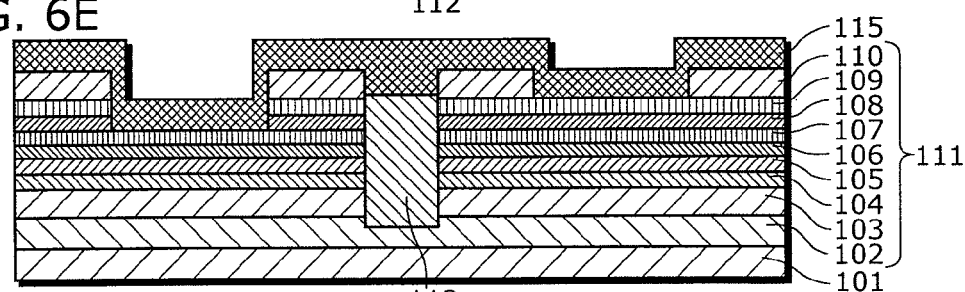
FIG. 6E illustrates a sectional structure in the manufacturing process of the semiconductor device.
Figure 6F:
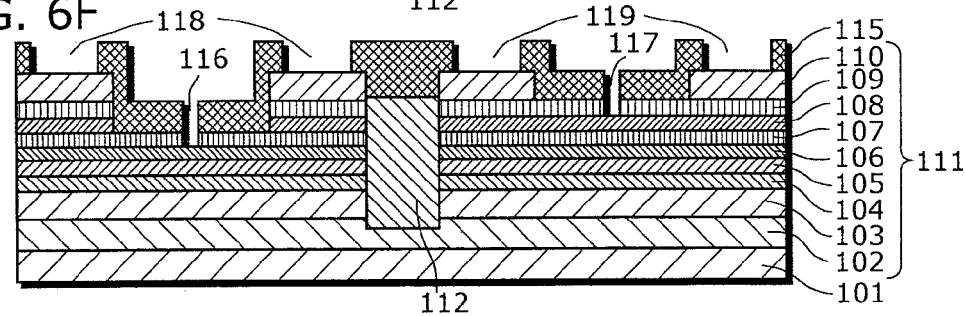
FIG. 6F illustrates a sectional structure in the manufacturing process of the semiconductor device.

The first etching stopper layer 107 is formed on the first threshold adjustment layer 106 and made of, for example, disordered InGaP with a thickness of 10 nm. Disordered refers to the state in which the atomic arrangement is in disorder, that is, not orderly arranged. This can reduce an on-resistance Ron. Further, materials with high etching selectivity are desired to be used for the first etching stopper layer 107. With this, etching can be easily stopped so as to expose the surface of the etching stopper layer 107 when forming a first recess opening 113 (see FIG. 6C). Further, when defining a gate opening 116, the first etching stopper layer 107 including its bottom surface can be easily removed through selective etching, without removing the top surface of the first threshold adjustment layer 106 (see, FIG. 6F). Further, by making the film thickness of the first etching stopper layer 107 equal to or greater than the film thickness of the second etching stopper layer 109 which will be described later, it is possible to distance the E-FET channel layer 104 from the surface of the insulating film 115 adjacent to the gate electrode 120. This can reduce an adverse effect caused by the surface.

The second threshold adjustment layer 108 is formed on the first etching stopper layer 107 and made of undoped AlGaAs with a thickness of 10 nm.

The second etching stopper layer 109 is formed on the second threshold adjustment layer 108 and made of, for example, disordered InGaP with a thickness of 5 nm.

The contact layer 110 is formed on the second etching stopper layer 109. The contact layer 110 is divided into four portions, to each of which the ohmic electrode 122 or 123 is connected. The contact layer 110 includes two layers. The lower layer is made of n-type GaAs with a thickness of 50 nm. The upper layer is made of n-type InGaAs with a thickness of 50 nm.

The isolation region 112 is formed through ion implantation, and electrically isolate the E-FET region 11 from the D-FET region 12.

The insulating film 115 is formed on the epitaxial layer 111 and the isolation region 112. The insulating film 115 is made of SiN, for example.

The gate electrode 120 is formed so as to be embedded in the opening defined in the insulating film 115 and the first etching stopper layer 107 in the E-FET region. The gate electrode 120 is made of, for example, Ti/Al/Ti. The gate electrode 120 forms a Schottky barrier junction with the first threshold adjustment layer 106. Since the threshold adjustment layer 106 is made of undoped material (AlGaAs), it is possible to suppress a decrease in the Vf.

The gate electrode 121 is formed so as to be embedded in the opening defined in the insulating film 115 and the second etching stopper layer 109 in the D-FET region. The gate electrode 121 is made of, for example, Ti/Al/Ti. The gate electrode 121 forms a Schottky barrier junction with the second threshold adjustment layer 108. Since the threshold adjustment layer 108 is made of undoped material (AlGaAs), it is possible to suppress a decrease in the Vf.

The ohmic electrodes 122 are electrodes of the E-FET, one is a source electrode and the other is a drain electrode, and are formed so that the gate electrode 120 is located in between. Each of the ohmic electrodes 122 is electrically connected to the channel layer 104 via the contact layer 110, the second etching stopper layer 109, the second threshold adjustment layer 108, the first etching stopper layer 107, the first threshold adjustment layer 106, and the donor layer 105, in the E-FET region 11. The ohmic electrodes 122 are formed so as to be embedded in openings defined in the insulating film 115 in the E-FET region 11. The ohmic electrodes 122 form ohmic contact with the contact layer 110.

The ohmic electrodes 123 are electrodes of the D-FET, one being a source electrode and the other being a drain electrode, and are formed so that the gate electrode 121 is located in between. Each of the ohmic electrodes 123 is electrically connected to the channel layer 104 via the contact layer 110, the second etching stopper layer 109, the second threshold adjustment layer 108, the first etching stopper layer 107, the first threshold adjustment layer 106, and the donor layer 105 in the D-FET region 12. The ohmic electrodes 123 are formed so as to be embedded in openings defined in the insulating film 115 in the D-FET region 12. The ohmic electrodes 123 form ohmic contact with the contact layer 110.

The semiconductor device 100 of the present embodiment includes the first etching stopper layer 107 and the second etching stopper layer 109, thereby improving controllability for the Vth. The semiconductor device 100 further includes the first threshold adjustment layer 106 and the second threshold adjustment layer 108. The first gate electrode 120 and the second gate electrode 121 are in contact with the first threshold adjustment layer 106 and the second threshold adjustment layer 108, respectively, thereby suppressing a decrease in the Vf.

A method of manufacturing the semiconductor device 100 illustrated in FIG. 5 will be described next.

FIGS. 6A to 6F illustrate sectional structures in a manufacturing process of the semiconductor device 100.

First, on the semiconductor substrate 101 made of semi-insulating GaAs, the buffer layer 102 made of GaAs, the buffer layer 103 made of AlGaAs, the channel layer 104 made of InGaAs, the donor layer 105 made of n-type AlGaAs, the first threshold adjustment layer 106 made of AlGaAs, the first etching stopper layer 107 made of InGaP, the second threshold adjustment layer 108 made of AlGaAs, the second etching stopper layer 109 made of InGaP, and the contact layer 110 made of GaAs and InGaAs are sequentially epitaxially grown through a MOCVD method, a MBE method, and the like. Here, the layers from the buffer layer 102 to the contact layer 110 which have been epitaxially grown are collectively referred to as the epitaxial layer 110. Through the steps described above, the structure illustrated in FIG. 6A is formed.

Next, a portion of the contact layer 110 to be the isolation region 112 is removed using a photoresist mask (not illustrated), so that the E-FET region 11 and the D-FET region 12 are defined. Further, the isolation region 112 is formed by, for example, implanting boron ions, so as to electrically isolate the E-FET region 11 and the D-FET region 12. Through the steps described above, the structure illustrated in FIG. 6B is formed.

Next, a first recess opening 113 in which the first gate electrode 120 is to be formed is defined by removing a portion from the contact layer 110, the second etching stopper layer 109, and the second threshold adjustment layer 108 using photoresist mask (not illustrated). The contact layer 110 is removed through, for example, selective dry-etching using mixed gas of $SiCl_4$, $SF_5$, and $N_2$, and the second etching stopper layer 109 positioned below is exposed. Next, the exposed portion of the second etching stopper layer 109 is removed through, for example, selective wet-etching using HCl-series mixed liquid and the second threshold adjustment layer 108 positioned below is exposed. Next, the exposed portion of the second threshold adjustment layer 108 is removed using, for example, mixed liquid of phosphate, hydrogen peroxide solution, and water and the first etching stopper layer 107 positioned below is exposed. Through the steps described above, the structure illustrated in FIG. 6C is formed.

Next, a second recess opening 114 in which the second gate electrode 121 is to be formed is defined by removing a portion from the contact layer 110 using photoresist mask (not illustrated). The contact layer 110 is removed through, for example, selective dry-etching using mixed gas of $SiCl_4$, $SF_5$, and $N_2$, and the second etching stopper layer 109 positioned below is exposed. Through the steps described above, the structure illustrated in FIG. 6D is formed.

Next, the insulating film 115 made of SiN is formed on all over the surface. Through the steps described above, the structure illustrated in FIG. 6E is formed.

Next, gate openings 116 and 117 and ohmic openings 118 and 119 are defined by removing portions from the insulating film 115 using photoresist mask (not illustrated). The gate electrodes 120 and 121 are formed in the gate openings 116 and 117, respectively. The ohmic electrodes 122 and 123 are formed in the ohmic openings 118 and 119, respectively. Further, a portion to form the gate opening 116 in which the gate electrode 120 is formed is removed from the first etching stopper layer 107, and a portion to form the gate opening 117 in which the gate electrode 121 is formed is removed from the second etching stopper layer 109, so that the gate openings 116 and 117 and the ohmic openings 118 and 119 are defined. The insulating film 115 is removed through, for example, selective dry-etching using mixed gas of $CHF_3$ and $SF_5$, and the first etching stopper layer 107, the second etching stopper layer 109, and the contact layer 110 are exposed. Further, the exposed portion of the first etching stopper layer 107 and the second etching stopper layer 109 are removed through, for example, selective wet-etching using HCl-series mixed liquid and the first threshold adjustment layer 106 and the second threshold adjustment layer 108 respectively positioned below are exposed. Through the steps described above, the structure illustrated in FIG. 6F is formed.

Next, Ti/Al/Ti is deposited all over the surface, for example, and then dry etching is performed by using a photoresist mask (not illustrated), so that the gate electrodes 120 and 121 and the ohmic electrodes 122 and 123 are formed. For example, dry etching using a mixed gas of $Cl_2$ and $BCl_3$ is performed. Through the steps described above, the structure of the semiconductor device 100 illustrated in FIG. 5 is formed.

As described above, with the method of manufacturing the semiconductor device 100 according to the present embodiment, controllability for the Vth is improved by employing selective etching when forming the first gate electrode and the second gate electrode. Accordingly, it is possible to form a semiconductor device which includes both the E-FET and the D-FET and has achieved features required for the E-FET.

Further, the E-FET gate electrode 120, the D-FET gate electrode 121, the E-FET ohmic electrode 122, and the D-FET ohmic electrode 123 are all formed simultaneously in the semiconductor device 100 according to the present invention. With this, it is possible to prevent increase in the number of processes that accompanies precision stabilization. Further, it is possible to achieve a simple processing at low cost.

Although the semiconductor device and the method of manufacturing the same according to the present embodiment have been described above, the present invention is not limited to this embodiment.

Figure 7:
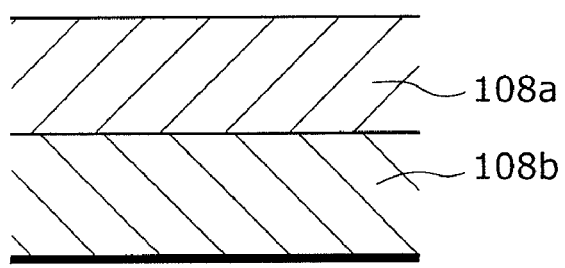
FIG. 7 illustrates a sectional structure of the second threshold adjustment layer having a multilayer structure.

For example, the second threshold adjustment layer 108, although formed as a single layer made of undoped AlGaAs in the above description, may have a multilayer structure including an upper layer 108a made of undoped AlGaAs and a lower layer 108b made of undoped GaAs as illustrated in FIG. 7.

Further, it has been described that the semiconductor substrate 101 is a GaAs substrate, however, the semiconductor substrate 101 may be a compound semiconductor substrate such as an InP substrate.

Further, the E-FET gate electrode 120, the D-FET gate electrode 121, the E-FET ohmic electrode 122, and the D-FET ohmic electrode 123 are made of Ti/Al/Ti according to the above description, however, it is not limited to this as long as each of the electrodes is made of a material capable of forming a Schottky barrier junction with or forming ohmic contact with each layer positioned under the electrode.

Second Embodiment

Figure 8:
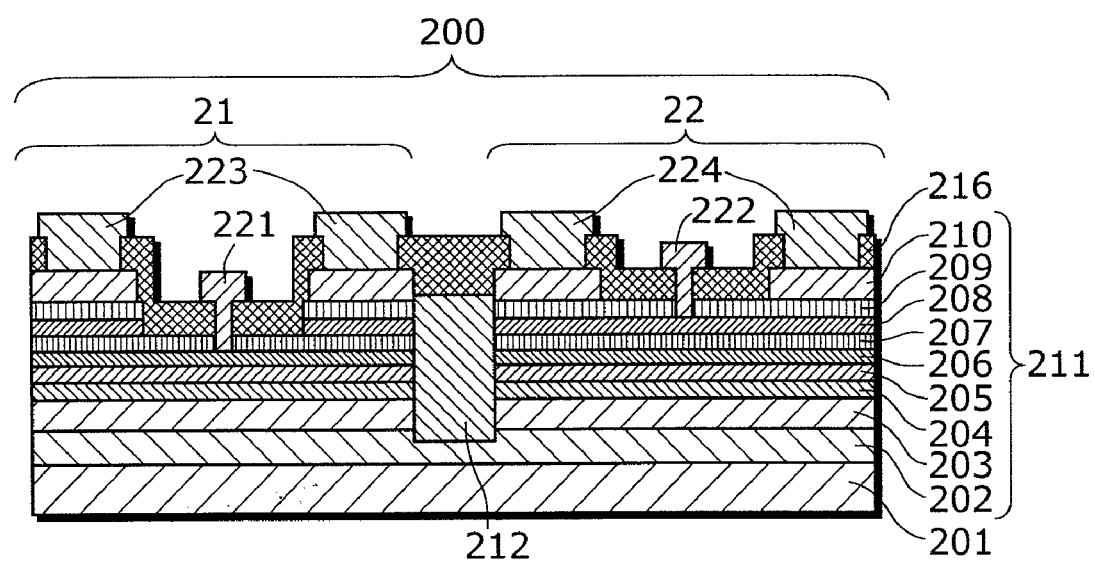
FIG. 8 is a sectional view illustrating a structure of a semiconductor device according to the second embodiment of the present invention.
Figure 9A:
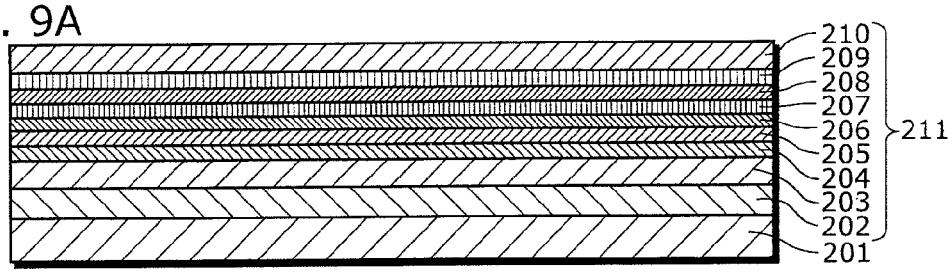
FIG. 9A illustrates a sectional structure in a manufacturing process of the semiconductor device.
Figure 9B:
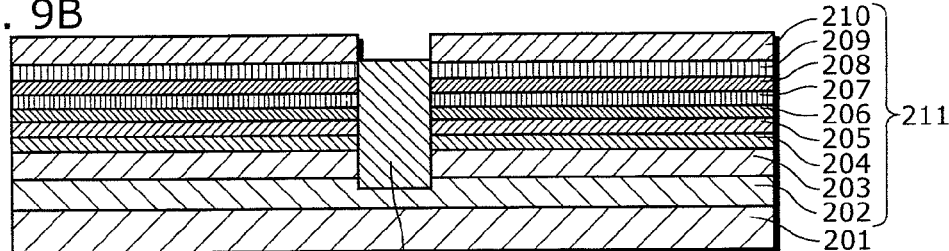
FIG. 9B illustrates a sectional structure in the manufacturing process of the semiconductor device.
Figure 9C:
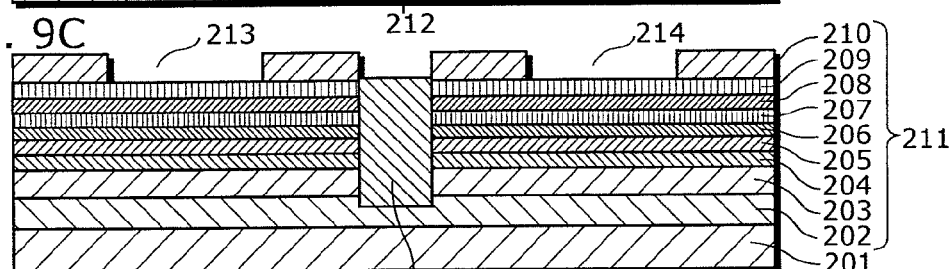
FIG. 9C illustrates a sectional structure in the manufacturing process of the semiconductor device.
Figure 9D:
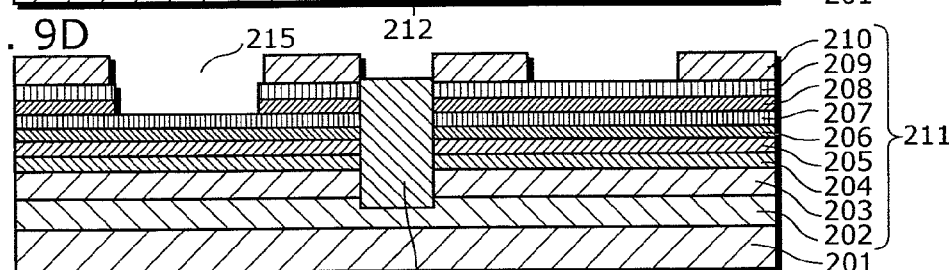
FIG. 9D illustrates a sectional structure in the manufacturing process of the semiconductor device.
Figure 9E:
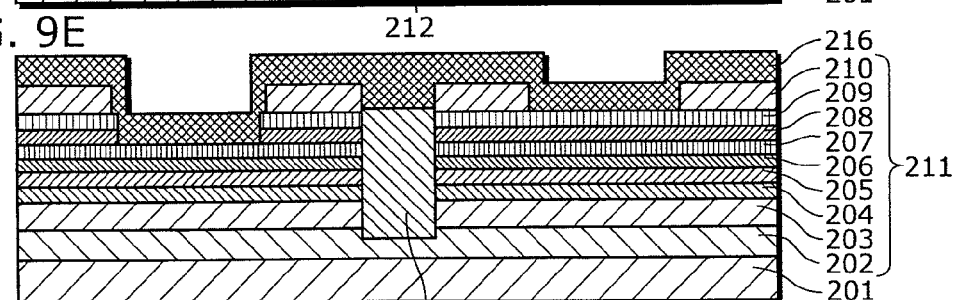
FIG. 9E illustrates a sectional structure in the manufacturing process of the semiconductor device.
Figure 9F:
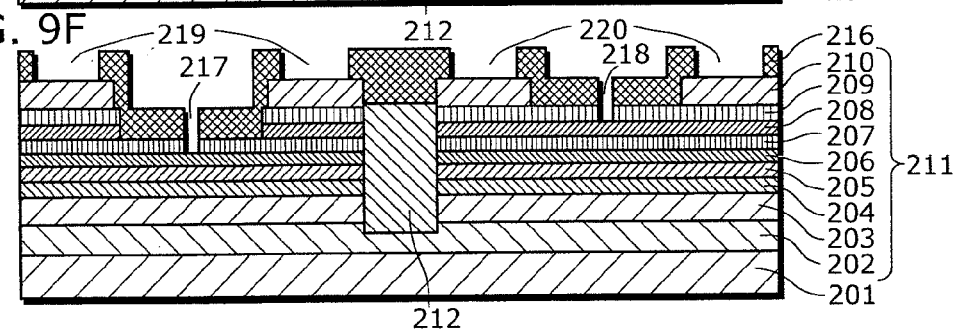
FIG. 9F illustrates a sectional structure in the manufacturing process of the semiconductor device.

FIG. 8 is a sectional view illustrating a structure of a semiconductor device according to the second embodiment of the present invention.

A semiconductor device 200 of FIG. 8 has a similar structure to and the same feature with the semiconductor device 100 of FIG. 5. The semiconductor device 200, an E-FET region 21, a D-FET region 22, a semiconductor substrate 201, buffer layers 202 and 203, a channel layer 204, a donor layer 205, a first threshold adjustment layer 206, a first etching stopper layer 207, a second threshold adjustment layer 208, a second etching stopper layer 209, a contact layer 210, an epitaxial layer 211, an isolation region 212, an insulating film 216, gate electrodes 221 and 222, and ohmic electrodes 223 and 224 correspond to the semiconductor device 100, the E-FET region 11, the D-FET region 12, the semiconductor substrate 101, buffer layers 102 and 103, the channel layer 104, the donor layer 105, the first threshold adjustment layer 106, the first etching stopper layer 107, the second threshold adjustment layer 108, the second etching stopper layer 109, the contact layer 110, the epitaxial layer 111, the isolation region 112, the insulating film 115, the gate electrodes 120 and 121, and the ohmic electrodes 122 and 123, respectively. The semiconductor device 200 is different from the semiconductor device 100 in that the insulating film 216 around the gate electrode 221 has a difference in level in an area where the second etching stopper layer 209 faces the contact layer 210. This difference is caused by that the recess opening for the E-FET is formed in two steps, not in a single step.

A method of manufacturing the semiconductor device 200 illustrated in FIG. 8 will be described next.

FIGS. 9A to 9F illustrate sectional structures in the manufacturing process of the semiconductor device 200.

First, on the semiconductor substrate 201 made of semi-insulating GaAs, the buffer layer 202 made of GaAs, the buffer layer 203 made of AlGaAs, the channel layer 204 made of InGaAs, the donor layer 205 made of AlGaAs, the first threshold adjustment layer 206 made of AlGaAs, the first etching stopper layer 207 made of InGaP, the second threshold adjustment layer 208 made of AlGaAs, the second etching stopper layer 209 made of InGaP, and the contact layer 210 made of GaAs and InGaAs are sequentially epitaxially grown through a MOCVD method, a MBE method, and the like. Here, the layers from the buffer layer 202 to the contact layer 210 which have been epitaxially grown are collectively referred to as the epitaxial layer 211. Through the steps described above, the structure illustrated in FIG. 9A is formed.

Next, a portion of the contact layer 210 to be the isolation region 212 is removed using a photoresist mask (not illustrated), so that the E-FET region 21 and the D-FET region 22 are defined. Further, the isolation region 212 is formed by, for example, implanting boron ions so as to electrically isolate the E-FET region 21 from the D-FET region 22. Through the steps described above, the structure illustrated in FIG. 9B is formed.

Next, a third recess opening 213 and a second recess opening 214 are defined by removing respective portions from the contact layer 210 using a photoresist mask (not illustrated). The gate electrode 221 of the E-FET region 21 is to be formed in the third recess opening 213. The gate electrode 222 of the D-FET region 22 is to be formed in the second recess opening 214. The contact layer 210 is removed through, for example, selective dry-etching using mixed gas of $SiCl_4$, $SF_5$, and $N_2$, and the second etching stopper layer 209 positioned below is exposed. Through the steps described above, the structure illustrated in FIG. 9C is formed.

Next, a portion of the second etching-stopper layer 209 and a portion of the second threshold adjustment layer 208 are removed, using photoresist mask (not illustrated), to form a forth recess opening 215 in which the gate electrode 221 is to be formed in the third recess opening of the E-FET region 21. The second etching stopper layer 209 is removed through, for example, selective wet-etching using HCl-series mixed liquid and the second threshold adjustment layer 208 positioned below is exposed. Then the second threshold adjustment layer 208 is removed through, for example, selective wet-etching using mixed liquid of phosphate, hydrogen peroxide solution, and water and the first etching stopper layer 207 positioned below is exposed. Through the steps described above, the structure illustrated in FIG. 9D is formed.

Next, the insulating film 216 made of SiN is formed. Through the steps described above, the structure illustrated in FIG. 9E is formed.

Next, in the insulating film 216, portions in which gate openings 217 and 218 and ohmic openings 219 and 220 are to be defined are removed using photoresist mask (not illustrated). The gate electrodes 221 and 222 are formed in the gate openings 217 and 218, respectively. The ohmic electrodes 223 and 224 are formed in the ohmic openings 219 and 220, respectively. Further, a portion to define the gate opening 217 in which the gate electrode 221 is to be formed is removed from the first etching stopper layer 207, and a portion to define the gate opening 218 in which the gate electrode 222 is to be formed is removed from the second etching stopper layer 209. Thus, the gate openings 217 and 218 and the ohmic openings 219 and 220 are defined. The insulating film 216 is removed through, for example, selective dry-etching using mixed gas of $CHF_3$ and $SF_5$, and the first etching stopper layer 207, the second etching stopper layer 209, and the contact layer 210 are exposed. Further, the first etching stopper layer 207 and the second etching stopper layer 209 are removed through, for example, selective wet-etching using HCl-series mixed liquid and the first threshold adjustment layer 206 and the second threshold adjustment layer 208 respectively positioned below are exposed. Through the steps described above, the structure illustrated in FIG. 9F is formed.

Next, Ti/Al/Ti is deposited all over the surface, for example, and then dry etching is performed by using a photoresist mask (not illustrated), so that the gate electrodes 221 and 222 and the ohmic electrodes 223 and 224 are formed. For example, dry etching using mixed gas of $Cl_2$ and $BCl_3$ is performed. Through the steps described above, the structure of the semiconductor device 200 illustrated in FIG. 8 is formed.

INDUSTRIAL APPLICABILITY

The present invention can be applied to semiconductor devices and methods thereof and, particularly to GaAsMMICs in which an E-FET and a D-FET are integrated. The present invention further can be applied to communication devices in which GaAsMMICs are used, especially to power amplifiers and switches for mobile telephone terminals.

What is claimed is:

1. A semiconductor device which includes an enhancement-mode field-effect transistor and a depletion-mode field-effect transistor on a same semiconductor substrate that includes GaAs, said semiconductor device comprising:

a first threshold adjustment layer including AlGaAs adjusting a threshold voltage of a gate of the enhancement-mode field-effect transistor;

a first etching stopper layer formed on said first threshold adjustment layer, said first etching stopper layer including disordered InGaP;

a second threshold adjustment layer formed on said first etching stopper layer, said second threshold adjustment layer adjusting the threshold voltage of a gate of the depletion-mode field-effect transistor and including AlGaAs;

a second etching stopper layer formed on said second threshold adjustment layer, said second etching stopper layer including disordered InGaP;

a contact layer formed on said second etching stopper layer;

a first source electrode and a first drain electrode, which are a source electrode and a drain electrode, respectively, in the enhancement-mode field-effect transistor, said first source electrode and said first drain electrode forming ohmic contact with said contact layer;

a second source electrode and a second drain electrode, which are a source electrode and a drain electrode, respectively, in the depletion-mode field-effect transistor, said second source electrode and said second drain electrode forming ohmic contact with said contact layer;

a first gate electrode of the enhancement-mode field-effect transistor, which is formed in an opening defined by removing said contact layer, said second etching stopper layer, and said second threshold adjustment layer, and which is in contact with said first threshold adjustment layer, said first gate electrode penetrating through said first etching stopper layer in a double recess structure; and a second gate electrode of the depletion-mode field-effect transistor, which is formed in an opening defined by removing said contact layer and which is in contact with said second threshold adjustment layer, said second gate electrode penetrating through said second etching stopper layer in the double recess structure.

2. The semiconductor device according to claim 1, wherein said first etching stopper layer has a film thickness equal to or greater than a film thickness of said second etching stopper layer.

3. The semiconductor device according to claim 1, wherein said second threshold adjustment layer includes at least one layer with a top layer containing AlGaAs.

4. The semiconductor device according to claim 3, wherein said second threshold adjustment layer includes a bottom layer containing GaAs.

5. The semiconductor device according to claim 1, wherein said first gate electrode, said second gate electrode, said first source electrode, said second source electrode, said first drain electrode, and said second drain electrode are made of a same material.

6. A method for manufacturing a semiconductor device which includes an enhancement-mode field-effect transistor and a depletion-mode field-effect transistor, said method comprising:

forming a first threshold adjustment layer on a semiconductor substrate;

forming a first etching stopper layer on the first threshold adjustment layer;

forming a second threshold adjustment layer on the first etching stopper layer;

forming a second etching stopper layer on the second threshold adjustment layer;

forming a contact layer on the second etching stopper layer;

forming a first recess opening in a first portion of the contact layer so as to expose the first etching stopper layer;

forming a second recess opening in a second portion of the contact layer so as to expose the second etching stopper layer;

forming an insulating film on the first recess opening and the second recess opening;

forming a first gate opening so as to expose the first threshold adjustment layer to the insulating film of the first recess opening, the first gate opening having a width smaller than a width of the first recess opening;

forming a first gate electrode of the enhancement-mode field-effect transistor in the first gate opening, which is in contact with the first threshold adjustment layer, the first gate electrode penetrating through the first etching stopper layer, the second threshold adjustment layer, and the second etching stopper layer;

forming a second gate opening so as to expose the second threshold adjustment layer to the insulating film of the second recess opening, the second gate opening having a width smaller than a width of the second recess opening; and forming a second gate electrode of the depletion-mode field-effect transistor in the second gate opening, which is in contact with the second threshold adjustment layer, the second gate electrode penetrating through the second etching stopper layer.

7. The method for manufacturing the semiconductor device according to claim 6, wherein said forming the first recess opening includes:
forming an opening for exposing the second etching stopper layer simultaneously with said forming the second recess opening; and
forming the first recess opening by exposing the first etching stopper layer to the opening for exposing the second etching stopper layer.

8. The manufacturing method for the semiconductor device according to claim 6,
wherein said forming the first gate electrode and said forming the second gate electrode are simultaneously performed.

9. The manufacturing method for the semiconductor device according to claim 6,
wherein, in said forming the first gate electrode and said forming the second gate electrode, the first gate electrode and the second gate electrode are simultaneously formed with a same material.

* * * * *